United States Patent

Gass et al.

[11] Patent Number: 5,818,130
[45] Date of Patent: Oct. 6, 1998

[54] METHOD AND ARRANGEMENT FOR APPROPRIATELY POLARITY RECOGNITION AND SWITCHOVER OF AN OUTPUT STAGE

[75] Inventors: Ernst Gass, Stuttgart; Sorin Fericean, Leonberg; Bernd Fingerle, Neuhausen; Heinz Kammerer, Ostildern, all of Germany

[73] Assignee: Gebhard Balluff GmbH & Co., Neuhausen/Fildern, Germany

[21] Appl. No.: 685,699

[22] Filed: Jul. 24, 1996

[30] Foreign Application Priority Data

Jul. 25, 1995 [DE] Germany ............ 195 27 175.0

[51] Int. Cl.⁶ .................................. H01H 83/08
[52] U.S. Cl. .................. 307/127; 307/138; 320/165; 327/28
[58] Field of Search ................ 307/127, 138; 320/165, 136; 324/524; 327/28; 335/78

[56] References Cited

U.S. PATENT DOCUMENTS

| | | | |
|---|---|---|---|
| 3,582,669 | 6/1971 | Dempsey | 307/127 |
| 3,624,338 | 11/1971 | Ellis | 307/127 |
| 3,731,179 | 5/1973 | Rademaker | 307/127 |
| 4,027,223 | 5/1977 | Renz | 320/165 |

*Primary Examiner*—Jeffrey A. Gaffin
*Assistant Examiner*—Albert W. Paladini
*Attorney, Agent, or Firm*—Darby & Darby

[57] ABSTRACT

For appropriately polarity recognition and corresponding switchover of a output stage of a proximity switch or the like connected to a supply voltage (VB), even while continuously activated, when a change in load polarity occurs, the proximity switch having in each case a high side driver and a low side driver, it is proposed to define on the output-side voltage axis between the positive supply voltage (+VB) and the negative pole or ground an upper and a lower detection window which sense the load configuration, each at a distance from the working points (which remain in a steady state) of each output stage driver, such that when a change in load configuration occurs, the potential of the output connection, to which the load configuration detection stage is connected, passes only briefly through these detection windows, and such that the transient signal changes which result therefrom in each window region are used for appropriately polarized switchover to the respective correct output stage circuit section based on a switchover of the load configuration detection stage.

13 Claims, 4 Drawing Sheets

METHOD AND ARRANGEMENT FOR APPROPRIATELY POLARITY RECOGNITION AND SWITCHOVER OF AN OUTPUT STAGE

BACKGROUND OF THE INVENTION +ps Prior Art

1. Field of the Invention

The invention is based on a method and an arrangement for appropriately polarity recognition and switchover of an output stage, and is particularly suitable for use in proximity or position switches and sensors, which usually have an output that switches toward the positive pole or toward the negative pole, even when the switch-over circuit is continuously connected to a supply voltage.

2. Description of the Related Art

The switching functions of position sensors of this kind can, for example, be designed in such a way that (in the actuated state) switching-on of a switch is effected (normally open), or a switching-off function is fulfilled (normally closed), the respective user being left at liberty to connect his circuit, as it continues on the output side, from the output of the position sensor either to the positive pole or to the negative pole (ground). Both wiring patterns are possible with no need for interventions in the region of the position sensor or its circuit (e.g. switching function programming as with known push-pull output stages). Thus a position sensor or proximity switch of this kind usually also has three output connections and possesses two output stage circuit sections, which can also be referred to as the high side driver and low side driver.

Known embodiments of such universal output stages are described, for example, in EP-0 396 695 B1, German Patent DE-39 05 163 C2, and German Published Application DE-43 05 385 A1. Each of the known circuits has on the output side two alternatively utilized load switches (for example transistorized pnp-ON or npn-ON) with three available emerging connection terminals and one interrogation device which, when the proximity switch is started up, interrogates to determine the pair of output terminals or connections between which the load being switched has been connected by the user.

Another problem with all these known universal output stages, however, is the circumstance that the interrogation device contains—understandably, so that the appropriately polarity load connection, once detected, is maintained as operation continues—one and only one memory element or flip-flop, which then necessarily operates so that when the output stage is first supplied on, a delay circuitry first inhibits it for a predefined initialization period so that time is available—and, more importantly, it is possible—to interrogate the load connection layout. Interrogation leads to setting of a memory element, by means of which the appropriate output stage section (i.e. the one corresponding to the load configuration), is selected. This programming stored in memory, is maintained until the proximity switch equipped with an output stage of this kind is once again taken out of operation, i.e. the supply voltage is cut off.

According to EP-0 396 695 B1, automatic load detection occurs during a proximity switch activation pulse suppression period in the course of the start-up phase, thus making available a time window which allows the load to be determined with the aid of an indicator current or a voltage. The result, i.e. one state or the other, is stored in a memory circuit that can be configured as a flip-flop, and the current direction is enabled by the load in either one direction or the other; this also ensures that both drivers are not switched on simultaneously. If sensors switching in the other direction are needed, for example because a control card has been replaced, the units no longer need to be removed; however, the only way to recondition them and thus adapt them to the new status is to first cut off the supply voltage and then apply it again. Operating changes that may occur in this context, for example due simply to changing the load configuration with the sensor in the switched-on state, or the activated state resulting from a high input signal, are not detected.

Similarly, with the switch arrangement according to German patent DE-39 05 163 C2, which in addition to a low-active and a high-active switch output also has a complementary switch output, application of supply voltage via a control logic arrangement and a capacitor does not lead until a later point in time to activation of a sensing device which detects the potential of the output terminal; for implementation of a complementary operating mode, high-resistance resistors of a voltage divider are provided, the resistance of which indicates the maximum detectable load impedance of an output terminal. Once a predefined time period has elapsed, the detected operating mode is written to a memory area; the operating mode automatically selected in this manner is retained as long as supply voltage is being applied. Automatic operating mode selection is repeated at every startup, i.e. every application of supply voltage to the unit. Thus with this known circuit as well, it is necessary, when the load configuration changes, first to disconnect the switch from its supply voltage in order to permit automatic operating mode selection.

According to the publications mentioned above (EP-0 396 695 B1, DE-39 05 163 C2, DE-43 05 385 A1), it is therefore not impossible for a perturbation in the load circuit, occurring during the time delay before availability, to lead to incorrect programming of the switch; this is problematical in that as a result, EMC (electromagnetic compatibility), for example in terms of so-called BURST pulses, cannot always be assured, since a single pulse on the output line can simulate a load that, when stored, results in an incorrect load configuration.

In contrast, it is therefore the object of the present invention to configure a universal output stage of the aforesaid kind with two output stage circuit sections, i.e. a high side driver and a low side driver, with automatic load configuration detection, in such a way that even in a continuously switched-on state, possibly even with a high-level input signal also present, a load configuration change applied from outside to the unit can be reacted to immediately with a corresponding operating mode switchover, without disconnection or other manipulations by the user. In other words this means that the circuit is brought back into the correct configuration immediately after the occurrence of, for example, burst pulses.

ADVANTAGES OF THE INVENTION

It is further advantageous to achieve the above objects while also being continuously prepared to react to load configuration changes, in particular even while switched on, which moreover makes it possible to dispense with long-term storage of an operating mode once it has been detected.

It is also advantageous that automatic load configuration recognition is nevertheless always possible regardless of the magnitude of the activated load, i.e. regardless of user-determined parameters. Known solutions are in fact non-functional without a time delay of several milliseconds. During this period they exhibit an undefined, high-resistance, interference-prone output that, as already mentioned, has a tendency to store incorrect information resulting from interference. Because the present circuit requires no delay, it is practically independent of interference and settles, immediately after application of supply voltage, into a defined, low-resistance state.

The technology preferably used for implementation allows, in addition to greater integration capability, the definition of stable working points for the two output stage circuit sections, which in turn makes possible the definition of more precise, relatively narrower detection windows on the output-side voltage axis between the supply voltage connections (+VB and −VB or ground), and common output connection of the high side and low side drivers.

Further advantages include a reverse polarity protected circuit; extremely small residual voltages and—in the integrated implementation—very low base or transverse currents are used in the chip, even though considerable currents can occur specifically with universal output stages of this kind, which are universally usable for proximity switches and allow appropriately polarized connection.

Another particular advantage of the present invention is the fact that despite the presence of a reverse polarity protection diode external to the chip, the residual drop voltage in the activated output stage section is comparatively very low, and does not exceed approximately twice the diode conducting-state voltage (2VBE). This is also attributable to the specific placement of the diode.

Another advantage which results, especially with the integrated embodiment, is a considerable reduction in the IC's power consumption, since pnp transistors are not used for the high side version of the driver, and npn transistors are not used for the low side version of the driver; another consideration is the variant in which the factor of the high side driver is very high, while the factor of the low side driver can be quite low, since in this case, in contrast to the high side driver, the base current does not occur as a transverse dissipation current in the IC, but rather is part of the load current.

SUMMARY OF THE INVENTION

In summary, therefore, the solution according to the invention yields the following advantages:

1. The invention involves continuous load configuration recognition by means of continuous measurement, so that
   Load switchover or load modification during operation is possible;
   and is effective not just during power on reset sequence (POR);
   due to the use of a logic circuit that is immediately ready to react, no memory elements are necessary; and
   An immediate response occurs whenever the load configuration changes.
2. The invention makes possible a low-power IC solution, with
   an npn-configured output stage section switching toward high potential (with a high amplification factor and very low base current IB in the form of an IC transverse current); and with
   a pnp-configured output stage section switching toward lower potential, such that the amplification factor can be low, but a correspondingly high base current IB appears as part of the load current.
3. No auxiliary magnitudes (voltage, current) are generated or detected.

4. No additional circuits are necessary to generate the indicator current or auxiliary voltages, hence:
   no current sources;
   or voltage dividers with high-resistance resistors, which in IC technology are complex and present reverse polarity problems.
5. The circuit ensures better overall immunity from disturbance, since after a fault it automatically returns to the correct state without requiring re-initialization; and lastly
6. A reverse polarity protected solution is achieved without a large outlay in terms of external components, with
7. Low residual voltages (VDP, VDM>2VBE).

Further embodiments and improvements of the invention are the subject of the subclaims, and described therein.

The method according to the invention, as well as the construction and mode of operation of an exemplified embodiment for carrying out the method, are explained below in detail with reference to the drawings, in which:

DESCRIPTION OF THE EXEMPLIFIED EMBODIMENTS

The basic idea of the present invention consists, in the case of a universal switch, specifically a proximity switch or the like, in making possible, as a function of a changing load configuration and by continuous observation of the output voltage axis between the supply voltages, appropriately polarized switchover between two output stage circuit sections even in a switched-on and activated state, by defining, outside the working points defined by the conducting-state voltages of the circuit sections, relatively narrow detection windows which are passed through only briefly as a change in load configuration occurs, thus resulting in signal changes that can be utilized for switchover.

Figure 1:
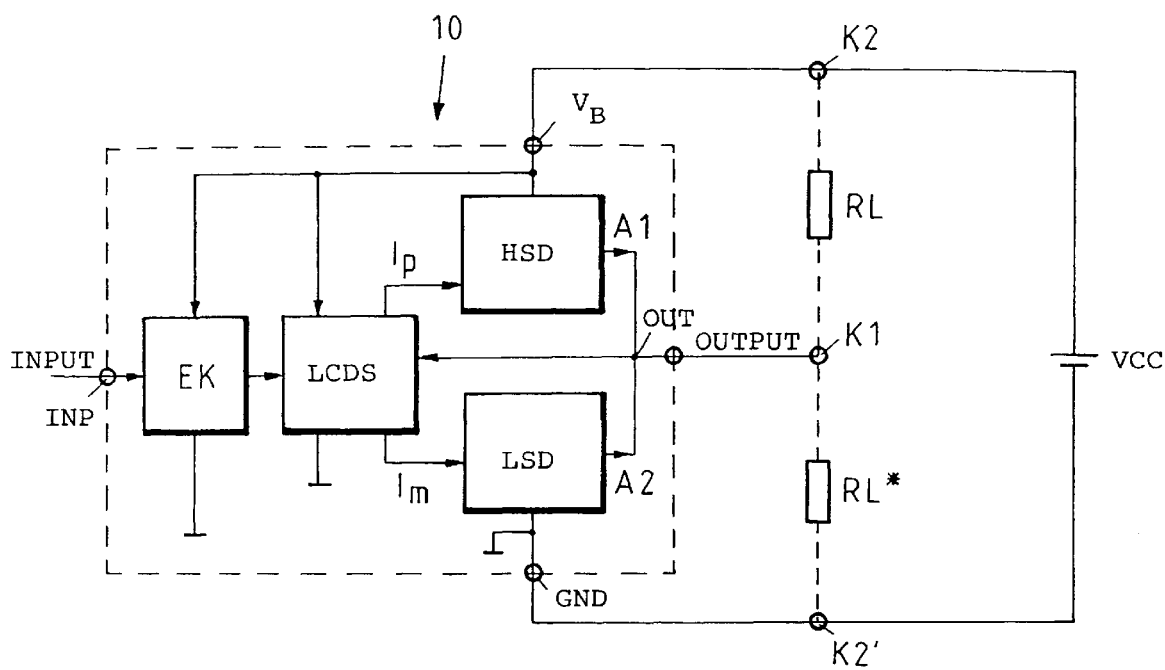
FIG. 1 shows a block diagram of the basic structure, illustrating the operating principle of the invention, with FIGS. 2a, 2b, and 2c indicating the respective resulting modes of operation on the output voltage axis, which also indicates the working points of the high side and low side drivers.

The block diagram depiction in FIG. 1 shows output stage 10 of a universal switch with two output stage circuit sections, namely a high side driver HSD and a low side driver LSD. As is usual, outputs A1 and A2 of the two drivers are combined into output OUT, which simultaneously constitutes the single (center) connection terminal K1, the other two connection terminals K2 and K2' being constituted by or identical to supply voltage connections +VB and −VB or GND (=ground) of a supply voltage source VCC for the circuit.

The input connection is labeled INP and can have delivered to it the output signal of any desired upstream circuit; as already mentioned above, the circuit can preferably be used as the output stage for proximity switches and the like. The input signal thus usually assumes only two states, namely low (no signal) or high (the proximity switch has responded), with a downstream input comparator EK ensuring a clean switching signal.

Figure 2A:
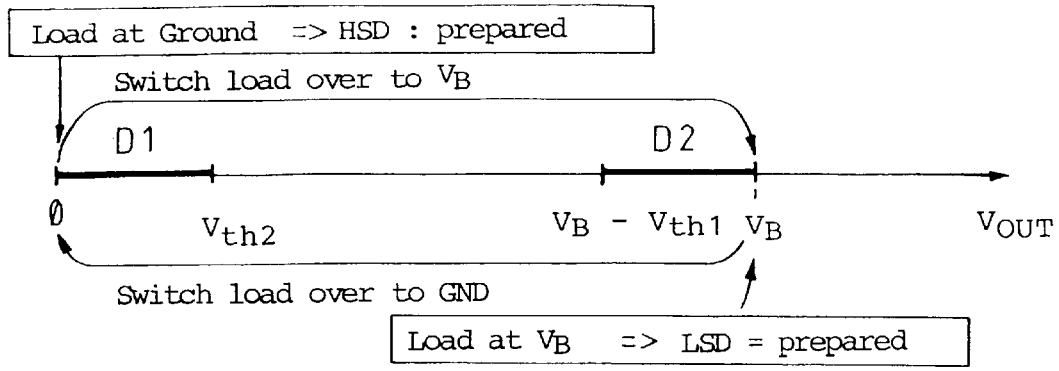
Figure 2B:
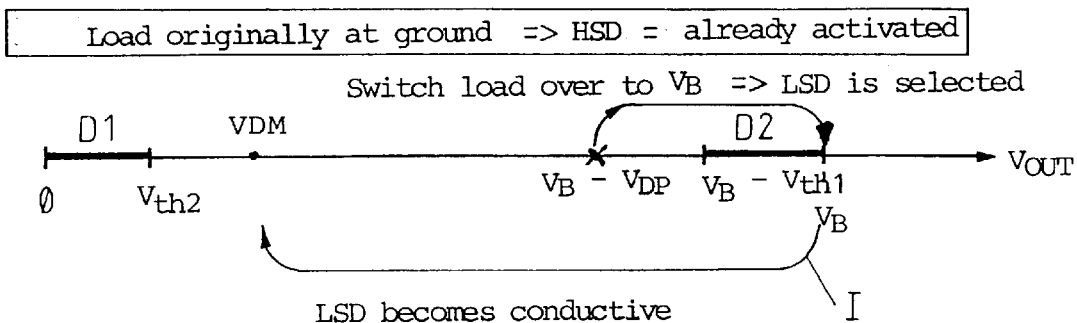
Figure 2C:
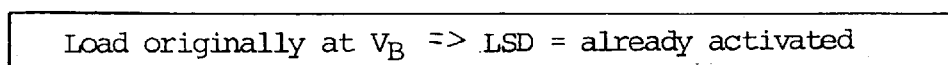
Figure 2C:
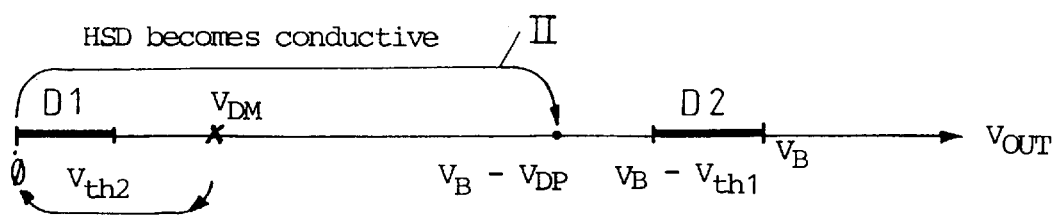

Also provided is a load configuration detection stage LCDS, which is connected to output connection OUT of the two drivers HSD and LSD and samples the voltage values occurring there; depending on the result, which will be discussed below with reference to the depiction of voltage diagrams in FIGS. 2a to 2c, it activates, in appropriately polarized fashion, either high side driver HSD by delivering a corresponding triggering current Ip, or low side driver LSD by delivering a current Im, so that depending on whether the load is located as a load RL between supply voltage VB and output OUT (at terminals K1 and K2), or between output OUT and ground connection GND (between terminals K1 and K2') as RL*, either low side driver LSD (for load RL) or high side driver HSD (for load RL*) is activated.

Load configuration detection stage LCDS is configured so that even signals of a temporary (transient) nature are sensed by it in relatively narrowly defined detection window regions of the voltage axis between terminals K2 and K2' or ground and supply voltage VB, and are used to activate the respective appropriately polarized output driver.

Defined according to diagram a) in FIG. 2 are a first detection window D1 on the voltage axis between zero and a switching or threshold voltage Vth2, and a second detection window D2 which extends analogously from the maximum supply voltage VB to a switching or threshold voltage value VB-Vth1 (from above).

The diagram a) shows the rather trivial case in which, although output stage 10 is connected to supply voltage, no input signal is present, so that due simply to the absence of this input signal neither of the output drivers HSD or LSD has become conductive. Nevertheless, even in this case it is of course possible, although of little advantage, to switch load RL*, originally applied at its one and therefore free connection to ground or terminal K2', over to terminal K2, i.e. to supply voltage VB. In the original state (load RL* to ground), the potential of terminal K1 (with drivers HSD and LSD not conducting) is also practically at ground potential, i.e. approximately 0 volts, so that the output signal interrogated by the load configuration detection stage is located inside first window D1, which means that as a result, high side driver HSD is prepared for activation and the load configuration detection stage is waiting only for the (so far absent) input signal in order to activate high side driver HSD. When the load, in the form of load RL, is then switched to VB, the output signal detected by load configuration detection stage LCDS then moves into second detection window D2, so that load configuration detection stage LCDS now prepares low side driver LSD for activation.

The two voltage diagrams b) and c) in FIG. 2 show the respective switching conditions which result with a high input signal and a circuit connected to supply voltage, i.e. in the fully activated state.

The assumption behind diagram b) is that the load, as RL*, is originally applied to ground GND, i.e. high side driver HSD is activated (i.e. has become conductive) due to delivery of a corresponding activation current Ip by the load configuration detection stage, resulting at output OUT in a potential VB-VDP (conducting-state voltage of the high side driver) that constitutes the working point and is set, practically regardless of the load magnitude (and moreover remains steady), in such a way that it lies definitely outside the upper detection window D2, to which is closer, and of course outside the lower detection window D1.

When the load is now switched over to the positive supply connection +VB, corresponding to terminal K2, the necessary result, at output OUT detected by load configuration detection stage LCDS, is a voltage state in which OUT assumes the potential of supply voltage VB or approximately that potential, i.e. in any event definitely passes briefly through detection window D2. Specifically, in order to switch load RL* over to VB, the load is disconnected from terminal K2' and it is connected to terminal K2, which is easily done since the result, assuming that high side driver HSD continues to conduct, is simply a closed circuit with no current flow, as is readily evident, so that supply voltage VB (which thus falls within detection window D2) necessarily occurs at terminal K1. This causes the load configuration detection stage to switch over or activate low side driver LSD, for example by appropriate delivery of an activation or base current Im; driver LSD is now activated, and draws down the voltage at output OUT to the working point VDM of the low side driver, i.e. to its conducting-state voltage. The voltage detected at output OUT thus follows the path of arrow I in diagram b), passing briefly through detection window D2 and settling at the new working point VDM on the voltage axis, without coming too close to the other detection window D1.

If, on the other hand, corresponding to diagram c) of FIG. 2, the load (as RL) is originally located at VB with low side driver LSD activated, then when the load is switched over to ground (terminal K2'), the voltage at output OUT sensed by the load configuration detection stage still changes, in the first moment, to the conducting-state voltage VDM of the negative-conducting driver, which of course initially still remains activated; however, breaking the connection between the load and terminal K2, and connecting the load to ground, necessarily results in practically ground potential, i.e. 0 volts, at terminal K1 and at the output connection of the two drivers, and the fact that low side driver LSD continues to conduct becomes meaningless. The detected voltage thus necessarily passes through detection window D1, and load configuration detection stage LCDS responds and makes high side driver HSD conductive, so that the voltage at output OUT—corresponding to the jump II in diagram c)—settles at the new working point VB-VDP (where VDP=conducting-state voltage of the high side driver). This working point is in turn safely remote from detection window D2, causing the load configuration detection stage to switch off low side driver LSD, having in fact of course already done so at the moment at which load configuration detection stage LCDS determined that the output signal passed through its lower window D1, while simultaneously activating the respective other driver.

It is obvious that defining two detection windows in this manner, with no permanent storage of switching criteria, allows an immediate switchover, i.e. continuous reaction to changing load configuration circumstances, with a simple structure; and, which is particularly important and will be explained in the exemplary embodiment below, also makes a circuit of this kind particularly suitable for integration.

Figure 3:
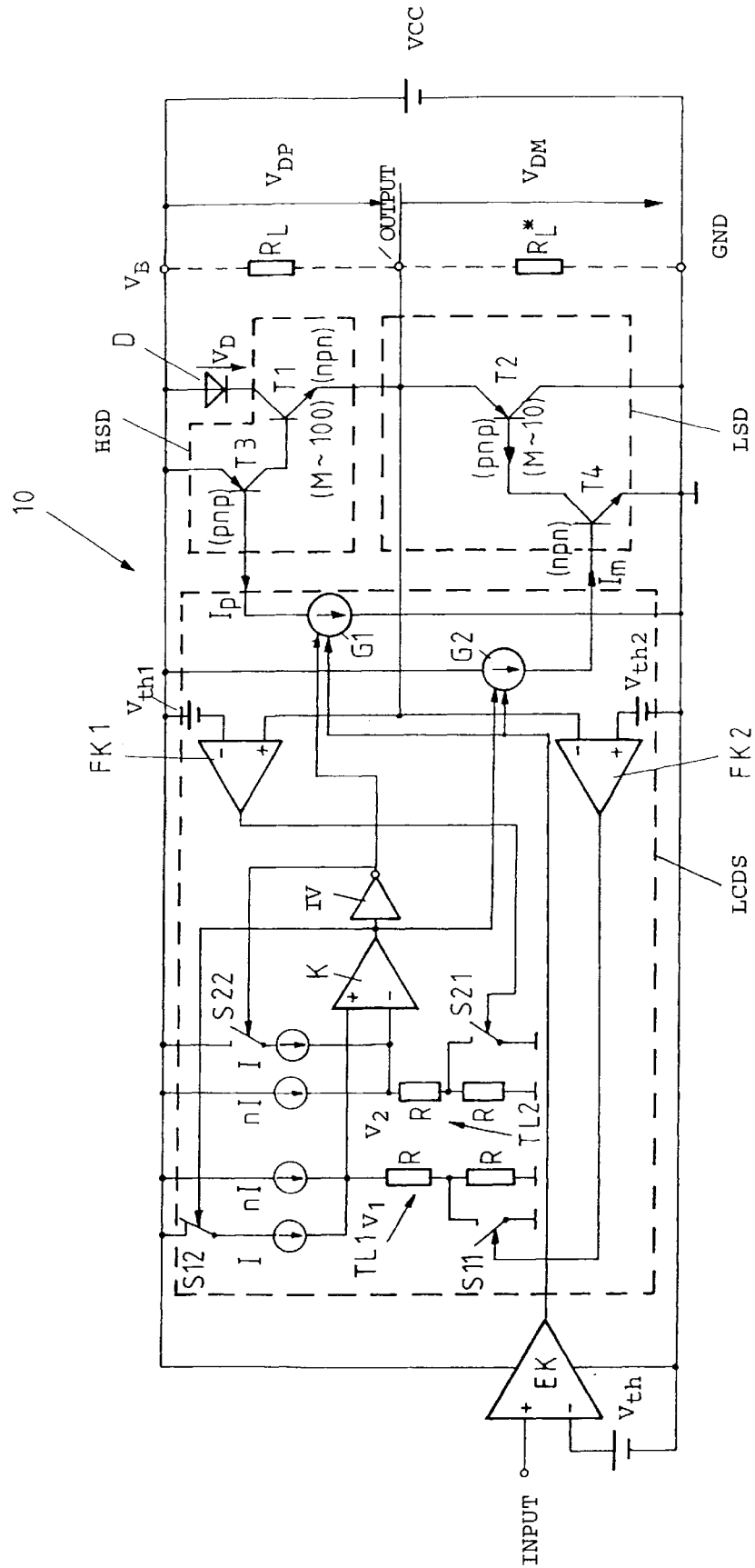
FIG. 3 shows a detailed exemplified embodiment of the invention as a preferred embodiment.

The representation in FIG. 3 shows a preferred embodiment of output stage 10; blocks mentioned in the block diagram, and now containing discrete components, are outlined with dashed lines and assigned the same reference symbols.

Load configuration detection stage LCDS comprises first of all two window comparator FK1 and FK2, usually in the form of operational amplifiers, to the one of whose inputs window bias voltages Vth1 and Vth2, which define the widths of windows D1 and D2, are conveyed; and whose other inputs, as is evident from FIG. 3, are connected to the common output connection OUT of the two drivers HSD and LSD.

In order to achieve, from the (transient) output signals of window comparators FK1 and FK2, the necessary triggering signals for the alternatively triggered current generators G1 and G2 for the two driver circuits HSD and LSD, load configuration detection stage LCDS comprises a main comparator K, which is configured as a threshold-controlled comparator or a comparator with controlled thresholds. Before discussing in more detail the operational sequences resulting therefrom, with particular reference to the diagrams of FIG. 4, it should be mentioned that although the implementation of load configuration detection stage LCDS depicted is the preferred exemplified embodiment and thus also the one reduced to practice, the present invention is nonetheless not restricted to it, since it is also possible to implement threshold-controlled comparator means, which have the operational sequences explained below, in other embodiments, optionally also with the use of different analog and/or associated hybrid and/or lastly also program-controlled digital circuit means (single-purpose computers, microcomputers, and the like).

In the exemplified embodiment depicted in FIG. 3, there are provided, in the threshold voltages with which the window comparators act on the inputs of main comparator K, divider circuits TL1 and TL2, controlled by the window comparators, each of which is symmetrically constructed and consists of a series circuit of two resistors R with a current source nI which can be connected in parallel with a further current source I. Current sources I and nI, which for simplicity's sake carry corresponding currents, generate via resistors R (also identical for simplicity's sake) voltage drops V1 and V2 which are applied to the comparator inputs, as depicted in the drawings. Threshold voltage V1 is applied to the positive input, and threshold voltage V2 to the negative input, of comparator K.

The output of window comparator FK2 controls a first switch S11 parallel to one of resistors R in voltage divider TL1, and the output of window comparator FK1 controls a second switch S21 parallel to one of resistors R, also, preferably, to the base resistor of second divider circuit TL2.

The output of comparator K is also connected, via a series switch S12, to current source I in first divider circuit TL1, so that this current source can be switched out or in as desired depending on the output configuration of comparator K; and another output of comparator K, or, in the exemplified embodiment illustrated, an inverter downstream from comparator K, switches a series switch S22 to current source I of the other divider circuit TL2, the same comparator outputs being connected to current generators G2 and G1 already mentioned above, which are simultaneously also connected to the output of input comparator EK, so that when a high signal is present at both of their outputs they trigger, for example, a respective downstream driver circuit.

Figure 4:
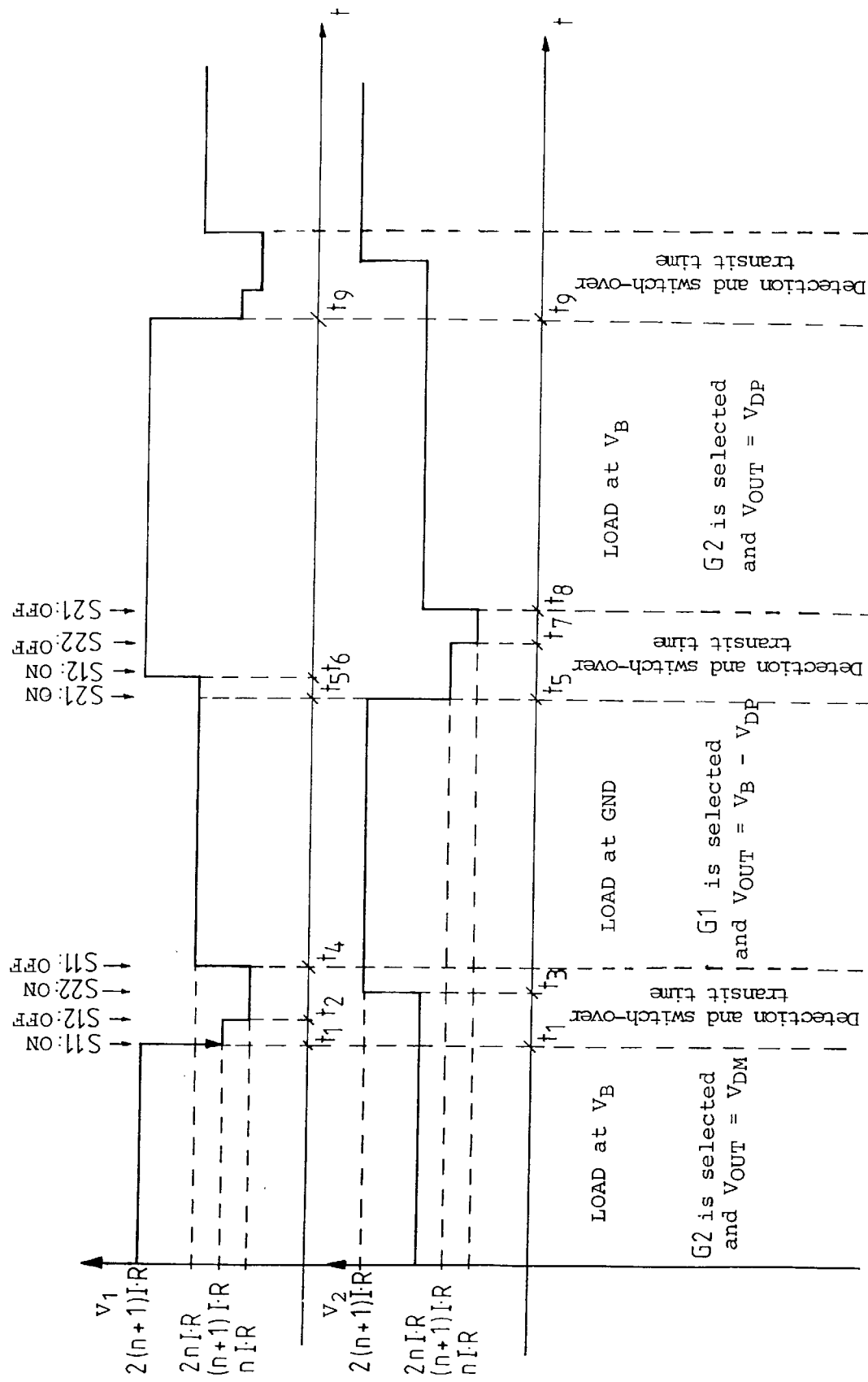
FIG. 4 shows comparative diagrams of the voltages at the inputs of a main comparator for detecting the load configuration over time.

A threshold-controlled comparator circuit of this kind then operates as follows, proceeding from the steady-state condition in which the load, as RL, is connected to supply voltage VB. In this case driver LSD (switching toward the negative) is activated, and the outputs of both window comparators FK1 and FK2, are low. This then results in an initial threshold voltage V1 or V2, as depicted in the diagram depicted in FIG. 4—in particular, also in quantitatively correct form as ordinate units—up to time t1. Switch S12 being closed, a current I(n+1) flows through the two resistors R, resulting in a value 2(n+1)I R for threshold voltage V1, as also indicated in FIG. 4; threshold voltage V2 at the negative input of main comparator K is accordingly 2nI R, i.e. is lower than the input voltage at the positive input. Current generator G2 (in the presence of input signal INP) is thus selected, and output voltage VOUT at output connection OUT corresponds to the conducting-state voltage of the low side driver (VOUT=VDM).

Moreover, for greater clarity, not only are the ordinate distances in the diagrams in FIG. 4 plotted in quantitatively correct fashion, but consideration is also given to differences in elapsed time, which are depicted on the time axis (abscissa).

Be it assumed that at time t1, the load is to be switched over from VB to GND, which means that at that point in time, as already explained earlier, a (transient) output signal at window comparator FK2 closes switch S11, causing threshold voltage V1 initially to drop to the value (n+1)I R, i.e. already below the (initially still) steady-state value 2n IR of comparative threshold voltage V2, if it is assumed that $n>1,$ which will be further discussed below. Several microseconds later, i.e. after the comparator K transit time corresponding to t2–t1 and at time t2 in the diagram in FIG. 2, switch S12 then also opens, triggered by the output of comparator K, and switches current I out of divider circuit TL1, resulting in a value n I R as the new intermediate value for threshold voltage V1. At the same time G2 is deactivated and driver LSD is thus switched out. Then as soon as inverter IV has also responded at time t3 (inverter transit time t3–t2). The new difference between threshold voltages V2 and V1 becomes even greater, since a current I due to closing of switch S22 is added to the current through voltage divider TL2, so that the value 2(n+1)I R now results as the new threshold voltage V2. Current source G1 is activated and driver HSD is thereby activated. Only after the transit time through the detection or window comparator FK2, corresponding to t4–t3, has elapsed—likewise after only a few microseconds -, does threshold voltage V1 then also jump back to its new steady-state value 2nI R, because switch S11, enabled by window comparator FK2, opens again; the switch positions at the respective points in time are moreover indicated above the voltage profiles, also in substantially quantitatively accurate fashion.

The load switchover has therefore also caused the two threshold voltages V1, V2 to assume new steady-state values which correspond to exactly the reverse of their original relationship, until—presumably—at a further time t5 another load switchover from ground to supply voltage VB occurs, to be explained below.

At time t5 switches S12 and S22, which are controlled by the outputs of the comparator or of its downstream inverter IV, have respective switch positions which are reversed as compared to the depiction of FIG. 3; upon load switching over to supply voltage +VB, the voltage passes through window D2 as shown by profile b) in FIG. 2; window comparator FK1 accordingly responds and, first of all, shorts out series resistor R in divider TL2 via its switch S21. As a result V2 drops from 2(n+1)I R, as already explained above with reference to threshold voltage V1, to (n+1)I R, and the two threshold voltages V1 and V2 once again exchange positions. Comparator K responds, and after its transit time t6–t5 has elapsed, S12 is closed again by the output of comparator K; an additional current I flows in divider TL1, and voltage V1 jumps to the (original and now new) value 2(n+1)I R which it then assumes in steady-state fashion until the next switchover. At the next time t7 (transit time t7–t6 through inverter IV having elapsed), switch S22 opens and, simultaneously with the triggering of current generator G2 which occurs at that point in time, the voltage difference between V1 and V2 decreases further, due to removal of the additional divider voltage I, until time t8, at which window comparator FK1 has completed its transit time and removes its consequently transient triggering signal from switch S21, so that the latter re-opens and thereby increases threshold voltage V2, specifically doubling its value, as is evident, although it nevertheless remains well below threshold voltage V1. In order to conform to this condition, the following functional relationship must apply:

$$\tfrac{1}{2}[2(n+1)IR] < 2nI\,R.$$

This functional equation then yields $$(n+1) < 2n$$

and thus the condition $$n > 1.$$

The hysteresis in the steady state (as is also evident from the ordinate distances of the profiles in FIG. 4 just explained) is:

$$H = [2(n+1)IR] - 2nIR$$

$$H = 2IR.$$

In the simplest case it is therefore comparator K, with its downstream inverter IV, of load configuration detection stage LCDS that, with its outputs, switches current generators G1 and G2 which then in turn deliver to driver circuits HSD and LSD the base current required for triggering. The two driver circuits are configured as Darlington circuits, and comprise one (or more) pre-transistors T3 and T4, and main transistors T1 and T2 with the latter's collectors connected to their bases. High side driver circuit HSD also has, in the collector circuit, a diode D ensuring appropriate circuit polarity, which is inserted between the supply voltage and the collector connection of the main transistor in the flow direction.

Thus a not inessential consideration with respect to this circuit is the ability to guarantee the respective working point, which is of significance simply because that working point must be kept well outside detection windows D1 and D2.

Detection windows D1 and D2 are constituted by switching or threshold voltages Vth1 and Vth2, already mentioned above, which are conveyed to first inputs of the two window comparators FK1 and FK2 and which, as shown in FIG. 3, can be generated either as bias voltages in a suitable manner, for example even by separate voltage sources; or diodes, the conducting-state voltages of which constitute the respective threshold voltages, can (preferably) be used to generate them. Here a further advantage can become evident, consisting in the fact that temperature dependencies affecting the reliable differences between the respective working points and the windows can be eliminated; because the working points are determined on the basis of the conducting-state voltages or conducting-state saturation voltages of the main transistors of the high side and low side drivers, temperature dependencies here can lead to a shift that can nevertheless then be practically intercepted and advantageously utilized if the bias voltages to the window comparators generated by the diodes shift in the same manner, so that the safety spacings between the working points and the detection windows are maintained.

The power dissipation that can be accepted or in fact tolerated by the IC also plays a role in its construction, from the standpoint that the load currents can be quite considerable and thus the base currents, which as transverse currents in the chip contribute to the power dissipation, could themselves be considerable if the factors of the integrated circuit are low. Not least among the significant features of the embodiment of FIG. 3 is therefore the circuit organization and distribution of transistors achieved therein, specifically in that npn transistors are used for the top, i.e. high side driver therein, and pnp transistors for the low side driver, with inverse pre-transistor structure in each case.

In order to minimize the base current of main transistor T1 of the top driver—which, as transverse current in the chip, contributes directly to the power dissipation—in the integrated version the npn main transistor T1 comprises a larger number of individual transistors, for example—in order to cite a specific number here as well, although it is not to be understood as limiting—100 individual transistors, so that each needs to contribute only a fraction of the total load current. This leads to correspondingly low base currents due to the low specific current density, and thus to correspondingly high factors, so that in specific terms, the total base current is less than with only one or a few main transistors in the top driver. In addition there is yet another reason for configuring main transistor T1 of the top driver in the form of, for example, 100 individual transistors, which will be addressed below in connection with the calculation of switching voltages for the windows.

In this connection, diode D for reverse polarity protection is moreover advantageously not a constituent of the integrated circuit, but is added later.

The number of transistors T2 in the integrated form is of less significance for the lower, i.e. low side driver LSD, since in the latter the driver current, i.e. the base current through main transistor T2, is part of the load current.

A particular advantage moreover results from the above-described topology of the circuit (arrangement of the two output drivers HSD, LSD), specifically in conjunction with the reverse polarity protection diode, in terms of general reverse polarity protection, since any conceivable type of possible miswiring when connecting loads and current sources (a total of 2×3!–2=10 reverse polarity situations) can be reliably managed.

The following calculations can be performed in order to keep the working points reliably outside the detection windows:

The following relationships apply to the conducting-state voltage VDP of the top, high side driver:

$$VDP = VCET3 + VBE1 = VD + VCET3$$

where
VDP=Conducting-state voltage at the working point of the top driver;
VCET3=Collector-emitter voltage of transistor T3;
VBE1=Base-emitter voltage of transistor T1;
VD=Diode conducting-state voltage;
VCET1=Collector-emitter voltage of transistor T1.

It may be assumed that the base-emitter voltage VBE1 is approximately equal to the diode conducting-state voltage; the result is then:

$$VBE1 \approx VD \Rightarrow VCET1 \approx VCET1.$$

This condition can be met in the integrated circuit by a packing density, i.e. number of transistors T1, of approximately $M=100.$ The relationships applicable to the low side driver are:

$VDM=VCET4+VBE2=VCET2.$

For this situation a quantity of approximately M=10 is sufficient for the integrated form of transistor T2, since T2 does not need to be driven toward saturation.

Since it is still true that $VDP>VBE$ and $VDM=VBE,$ it is then possible to select, for the switching voltages of the window comparators:

$Vth2=VBE$ and $Vth1=VBE.$

The high transistor count for main transistor T1 of the top, high side driver therefore meets the required condition VCET1=VCET3, and at the same time ensures that, because of the relatively low collector currents of each individual transistor, the base factor can reach very high values in the integrated form, so that the base current manifesting itself as a transverse current is, considered specifically, much lower as a total dissipated current than in the case in which only one or a few transistors T1, with a then considerably lower factor, would require a very high base transverse current in order to ensure the necessary load current. Lastly, it is also particularly advantageous that a topology of this kind also requires only a correspondingly very small amount of space.

We claim:

1. A method for load polarity recognition and corresponding switching of an output stage even when continuously connected to a supply voltage (VB), said method comprising the following steps:

detecting a change in load polarity using a load configuration detection stage (LCDS) which recognizes the polarity connection of the load, said load configuration detection stage having a first output signal which enables a high side driver and a second output signal which enables a low side driver, said high side driver maintaining said load at a first operating point voltage during steady state operation when said high side driver is activated and said low side driver maintaining said load at a second operating point voltage during steady state operation when said low side driver is activated;

defining for an output voltage associated with said load, an upper detection window (D2) and a lower detection window (D1) between said supply voltage (VB) and a negative or ground voltage, said detection windows being defined substantially independently of a particular application configuration;

maintaining said first operating voltage point a minimum distance from said upper detection window;

maintaining said second operating voltage point a minimum distance from said lower detection window;

said polarity change detection step further comprising the step of detecting said output voltage at said load as it passes through one of said detection windows when a change in load configuration occurs; and generating short term signal changes when said output voltage passes through one of said detection windows and using said short term signal changes to effect the deactivation of one of said high said driver and low side driver and the activation of the other of said high side driver and low side driver using said first and second output signals.

2. The method of claim 1, wherein said upper detection window is defined using a first window comparator having a first input connected to a first threshold voltage, a second input connected to said output voltage, and a first comparator output signal, and said lower detection window is defined using a second window comparator having a first input connected to a second threshold voltage, a second input connected to said output voltage, and a second comparator output signal, at least one of said first and second comparators detecting said output voltage as it approaches the supply voltage or ground voltage, respectively, when said load configuration changes and providing said comparator output signals to a downstream threshold-controlled comparator which activates one of said high side driver and said low side driver based on said comparator output signals.

3. A circuit for load polarity recognition and corresponding switching of an output stage even when continuously connected to a supply voltage (VB), said circuit comprising:

a load configuration detection stage which recognizes the connection polarity of said load, said load configuration detection stage having a first output signal which enables a high side driver and a second output signal which enables a low side driver;

a first window comparator (FK1) having a first input connected to a first threshold voltage, a second input connected to said output voltage, and a first comparator output signal;

a second window comparator (FK2) having a first input connected to a second threshold voltage, a second input connected to said output voltage, and a second comparator output signal;

said comparator output signals being used to switch the application of said supply voltage and a negative or ground voltage to said load; and a circuit for generating an upper detection window (D2) and a lower detection window (D1) between said supply voltage (VB) and said negative or ground voltage.

4. The circuit of claim 3, wherein said main comparator is configured as a threshold controlled comparator having a first, inverting input connected to a starting threshold, and having an output which remains in a steady state condition until a next change in load configuration, said threshold controlled comparator output controlling the delivery of a switching-on current to a driver selected from among said high side and low side drivers, said circuit further including a switched divider network wherein the switches of said switched divider network are controlled by said threshold controlled comparator output and act to adjust the threshold signal at the input of said threshold controlled comparator, to thereby provide hysteresis of said input threshold voltage.

5. The circuit of claim 3, further comprising a plurality of trigger switches (S11, S21) which are controlled by said comparator output signals, to thereby effect a threshold voltage change at an input of a main comparator (K).

6. The circuit of claim 5, wherein said load configuration detection stage further comprises:

a main comparator;

a first input voltage divider (TL1) comprising first and second series connected resistors, and a controlled current source (I) and an uncontrolled current source (nI);

a second voltage divider (TL2) comprising first and second series connected resistors, and a controlled current source (I) and an uncontrolled current source (nI);

at least one of said first and second comparator output signals switching one of said series connected resistors in at least one of said voltage dividers and also switching said controlled current sources in said voltage dividers.

7. The circuit of claim 6, wherein said high side and low side drivers are each configured as a Darlington configuration, and wherein said high side driver includes a reverse polarity protection diode (D) in series between said supply voltage (VB) and a collector of a transistor of said Darlington configuration.

8. The circuit of claim 7, further comprising an inverter (IV) having an output and having its input connected to the output of said main comparator (K), wherein the output of said main comparator (K) and the output of said inverter (IV) control a plurality of current generators (G1, G2) which provide base current to the pre-transistors of the high side and low side drivers.

9. The circuit of claim 7, wherein the high side and low side drivers are formed as an integrated circuit, said high side driver including a pnp pre-transistor (T3) and a plurality of npn main transistors (T1), such that the base transverse current and the power dissipation in the integrated circuit are reduced, said low side driver including an npn pre-transistor (T4) and a plurality of pnp main transistors (T2), wherein the number of pnp main transistors in the low side driver is less than the number of pnp main transistors in the high side driver.

10. The circuit of claim 9, wherein the number of pnp main transistors in the low side driver is approximately one order of magnitude less than the number of pnp main transistors in the high side driver.

11. The circuit of claim 9, wherein said plurality of npn transistors in said high side driver comprise 100 individual transistors having their base current supplied by one or more pnp pre-transistors (T3).

12. The circuit of claim 9, wherein said first and second threshold voltages correspond substantially to the base-emitter voltage (VBE) of the main transistors (T1, T2) of the high side and low side drivers.

13. The circuit of claim 12, wherein the respective spacing between each of the first and second threshold voltages and each of the first and second operating point voltages is substantially temperature independent, said circuit further comprising a first diode connected between said supply voltage (VB) and said first input of said first window comparator for generating said first threshold voltage, a second diode connected between said ground or negative supply and said first input of said second window comparator for generating said second threshold voltage, wherein a substantially constant current flows through each of said diodes, and the temperature-based voltage change of said diodes corresponds substantially to the temperature-based voltage change of said first and second operating point voltages.

* * * * *